(12) United States Patent
Val

(10) Patent No.: US 8,243,468 B2
(45) Date of Patent: Aug. 14, 2012

(54) LOW-THICKNESS ELECTRONIC MODULE COMPRISING A STACK OF ELECTRONIC PACKAGES PROVIDED WITH CONNECTION BALLS

(75) Inventor: Christian Val, St Remy les Chevreuse (FR)

(73) Assignee: 3D Plus (FR)

( * ) Notice: Subject to any disclaimer, the term of this patent is extended or adjusted under 35 U.S.C. 154(b) by 982 days.

(21) Appl. No.: 11/910,433

(22) PCT Filed: Apr. 3, 2006

(86) PCT No.: PCT/EP2006/061281
§ 371 (c)(1),
(2), (4) Date: Apr. 1, 2008

(87) PCT Pub. No.: WO2006/103299
PCT Pub. Date: Oct. 5, 2006

(65) Prior Publication Data
US 2008/0170374 A1    Jul. 17, 2008

(30) Foreign Application Priority Data

Apr. 1, 2005 (FR) .................................. 05 03207
Jun. 10, 2005 (FR) .................................. 05 05926

(51) Int. Cl.
*H01R 12/16* (2006.01)
(52) U.S. Cl. ......... 361/790; 361/770; 361/772; 361/774
(58) Field of Classification Search .......... 361/770–775, 361/790
See application file for complete search history.

(56) References Cited

U.S. PATENT DOCUMENTS

| | | | |
|---|---|---|---|
| 4,408,256 A | 10/1983 | Val | |
| 4,518,818 A | 5/1985 | Le Ny et al. | |
| 4,553,020 A | 11/1985 | Val | |
| 4,755,910 A | 7/1988 | Val | |
| 5,002,895 A | 3/1991 | LeParquier et al. | |
| 5,237,204 A | 8/1993 | Val | |
| 5,323,533 A | 6/1994 | Val | |
| 5,400,218 A | 3/1995 | Val | |
| 5,461,545 A | 10/1995 | Leroy et al. | |

(Continued)

FOREIGN PATENT DOCUMENTS

JP    09036537    2/1997
(Continued)

OTHER PUBLICATIONS

U.S. Appl. No. 06/148,043, filed Feb. 8, 1982 and abandoned on Feb. 8, 1982.

(Continued)

*Primary Examiner* — Tuan T Dinh
(74) *Attorney, Agent, or Firm* — Lowe Hauptman Ham & Berner, LLP

(57) ABSTRACT

The invention relates to an electronic module comprising a stack of n packages of predetermined thickness E, which are provided on a lower surface with connection balls of predetermined thickness $e_b$, said connection balls being connected to a printed circuit for interconnecting the package. The printed circuit is placed on the lower surface of the package level with the balls, is drilled with metallized holes, in which the balls are located and to which they are connected, and has a thickness $e_{ci}$ less than $e_b$ so as to obtain a module with a total thickness not exceeding $n(E+10\% \, e_b)$.

10 Claims, 8 Drawing Sheets

U.S. PATENT DOCUMENTS

| | | | |
|---|---|---|---|
| 5,526,230 | A | 6/1996 | Val |
| 5,637,536 | A | 6/1997 | Val |
| 5,640,760 | A | 6/1997 | Val et al. |
| 5,828,128 | A | 10/1998 | Higashiguchi et al. |
| 5,847,448 | A | 12/1998 | Val et al. |
| 5,885,850 | A | 3/1999 | Val |
| 6,087,597 | A | 7/2000 | Shimada et al. |
| 6,249,131 | B1 | 6/2001 | Nangle |
| 6,307,261 | B1 | 10/2001 | Val et al. |
| 6,563,217 | B2 * | 5/2003 | Corisis et al. ............ 257/738 |
| 6,714,418 | B2 * | 3/2004 | Frankowsky et al. ....... 361/735 |
| 6,716,672 | B2 | 4/2004 | Val |
| 6,809,367 | B2 | 10/2004 | Val |
| 2002/0020058 | A1 | 2/2002 | Saito et al. |
| 2003/0030143 | A1 | 2/2003 | Weennemuth et al. |
| 2003/0043650 | A1 | 3/2003 | Kato et al. |
| 2003/0080438 | A1 | 5/2003 | Matsuura et al. |
| 2003/0173673 | A1 | 9/2003 | Val |
| 2005/0012188 | A1 | 1/2005 | Val |
| 2007/0117369 | A1 | 5/2007 | Val et al. |
| 2007/0262443 | A1 | 11/2007 | Val et al. |

FOREIGN PATENT DOCUMENTS

| | | |
|---|---|---|
| JP | 2001168511 | 6/2001 |

OTHER PUBLICATIONS

U.S. Appl. No. 06/201,870, filed Nov. 3, 1980 and abandoned on Nov. 9, 1990.

U.S. Appl. No. 06/274,205, filed Jan. 4, 1984 and abandoned on Dec. 2, 1983.

U.S. Appl. No. 06/296,650, filed Aug. 27, 1981 and abandoned on Jan. 4, 1986.

U.S. Appl. No. 06/507,808, filed Jun. 24, 1983 and abandoned on Sep. 26, 1985.

U.S. Appl. No. 06/735,731, filed May 20, 1985 and abandoned on Dec. 7, 1987.

U.S. Appl. No. 07/131,238, filed Dec. 7, 1987 and abandoned on Jun. 2, 1989.

U.S. Appl. No. 07/361,694, filed Jun. 2, 1989 and abandoned on Aug. 26, 1991.

U.S. Appl. No. 07/030,854, filed May 12, 1987 and abandoned on Aug. 1, 1988.

U.S. Appl. No. 07/226,512, filed Aug. 1, 1988 and abandoned on Nov. 15, 1989.

U.S. Appl. No. 06/920,073, filed Oct. 16, 1986 and abandoned on Sep. 22, 1989.

U.S. Appl. No. 07/026,228, filed Jan. 29, 1987 and abandoned on Apr. 2, 1996.

U.S. Appl. No. 07/092,295, filed Sep. 2, 1987 and abandoned on Jan. 12, 1989.

U.S. Appl. No. 07/296,797, filed Jan. 12, 1989 and abandoned on Sep. 15, 1989.

U.S. Appl. No. 07/407,532, filed Sep. 15, 1989 and abandoned on May 21, 1990.

U.S. Appl. No. 07/527,714, filed May 21, 1990 and abandoned on Oct. 28, 1991.

U.S. Appl. No. 07/181,740, filed Apr. 14, 1988 and abandoned on Nov. 3, 1989.

U.S. Appl. No. 07/272,376, filed Nov. 17, 1988 and abandoned on Jul. 8, 1991.

U.S. Appl. No. 07/728,325, filed Jul. 8, 1991 and abandoned on Dec. 10, 1992.

U.S. Appl. No. 07/989,871, filed Dec. 10, 1992 and abandoned on Aug. 13, 1993.

U.S. Appl. No. 07/844,631, filed Aug. 23, 1991 and abandoned on Sep. 13, 1996.

U.S. Appl. No. 07/920,482, filed Dec. 6, 1991 and abandoned on Aug. 12, 1996.

U.S. Appl. No. 08/289,855, filed Aug. 12, 1994 and abandoned on Nov. 15, 1996.

U.S. Appl. No. 08/604,752, filed Feb. 23, 1996 and abandoned on Jun. 12, 1998.

U.S. Appl. No. 08/531,407, filed Apr. 15, 1994 and abandoned on Sep. 6, 1996.

U.S. Appl. No. 08/544,478, filed Oct. 18, 1995 and abandoned on Mar. 3, 1997.

* cited by examiner

LOW-THICKNESS ELECTRONIC MODULE COMPRISING A STACK OF ELECTRONIC PACKAGES PROVIDED WITH CONNECTION BALLS

CROSS-REFERENCE TO RELATED APPLICATIONS

The present Application is based on International Application No. PCT/EP2006/061281, filed Apr. 3, 2006, which in turn corresponds to France Application No. 0503207, filed Apr. 1, 2005 and France Application No. 0505926, filed Jun. 10, 2005 and priority is hereby claimed under 35 USC §119 based on these applications. Each of these applications are hereby incorporated by reference in their entirety into the present application.

TECHNICAL FIELD

The invention relates to an electronic module of small thickness, which comprises a stack of electronic packages.

BACKGROUND OF THE INVENTION

These packages comprise a printed circuit with at least one chip, encapsulated by a protective resin, and are provided on their lower surface with connection balls. These are for example packages of the BGA (Ball Grid Array) or FBGA (Fine Ball Grid Array) type.

They are stacked to form an electronic module. FIG. 1a shows, in cross section, a known electronic module 100 comprising two packages 10a, 10b. It includes, for each package, a circuit 20 for interconnecting the package shown in FIG. 1b seen from above, the area of which is the same size as that of the package, and the tracks 21 of which connects pads 22 positioned facing the balls 12, at the edges of the circuit. A central band, with no connections or pads, corresponds to the central band of the lower surface of the package that protects the wires of the wiring connecting the balls to the printed circuit of the package. These circuits 20 are connected together via their edges, in this case by a metal bus 30 located on one side of the module. Connection balls 12 are placed beneath the lower interconnection circuit 10a for connecting the module 100 to an interconnection substrate 200. An insulating lacquer 14 is placed beneath the lower surface of body 11 of the package.

At the present time, electronic modules are subject to thickness and area constraints—a module with two packages must not exceed 2.7 mm in thickness and its area must not exceed that of a package. A package body 11 typically has a thickness of 0.8 mm, a printed interconnection circuit 20 has a thickness of 0.15 mm and a connection ball 12 has a thickness of 0.4 mm. The overall thickness is 3.1 mm, and therefore exceeds the required limit.

SUMMARY OF THE INVENTION

The object of the invention is to propose an electronic module that meets these thickness and area constraints.

One subject of the invention is an electronic module comprising a stack of n packages of predetermined thickness E, where n>1, each package being provided on the lower surface of the body of the package with connection balls of predetermined thickness $e_b$ and, connected to these balls, with a printed circuit for interconnecting the package. It is mainly characterized in that the printed circuit is placed on the lower surface of the body of the package level with the balls, is drilled with metallized holes, in which the balls are located and to which they are connected, and has a thickness $e_{ci}$ less than $e_b$ so as to obtain a module with a total thickness not exceeding n (E+10% $e_b$).

In this way, the interconnection circuit of the package is integrated between the balls. It therefore does not add thickness to the package, nor does it increase its area. The thickness of each package is thus reduced by the thickness of the printed connection circuit.

According to one feature of the invention, the electronic module includes a lateral element for connecting the drilled circuits together and the stack has a lower package and upper packages, the drilled printed circuit of the lower package includes at least one ball not connected to the lower package and intended for connecting an upper package to an interconnection substrate of the module, via the drilled printed circuit and the lateral connection element.

According to a first embodiment of the invention, the drilled printed circuits are connected together by a metal bus.

According to another embodiment, at least two drilled printed circuits are connected together by a lateral connection element which forms, with these drilled printed circuits, a flexible circuit called a flex circuit.

This flex circuit may be in the form of a concertina.

Advantageously, the module includes at least one capacitor film placed on and/or beneath each package.

Preferably, the holes are approximately circular and have a diameter $d_p$ equal to or greater than the diameter $e_b$ of the balls, so that the balls pass through the drilled printed circuit before they are connected, or less than the diameter $e_b$ of the balls, so as to at least reduce the routable area of the printed circuit.

Another subject of the invention is an electronic package of predetermined thickness E, provided on the lower surface of the body of the package with connection balls of predetermined thickness $e_b$, characterized in that it includes a printed circuit for interconnecting the package and placed on the lower surface of the body of the package level with the balls, which circuit is drilled with approximately circular metallized holes in which the balls are located and to which they are connected, and has a thickness $e_{ci}$ less than $e_b$ so as to obtain a package with a total thickness not exceeding E+10% $e_b$.

Preferably, the drilled printed circuit includes at least one ball not connected to the package or a soldered hole not connected to the package.

According to one feature of the invention, the holes are approximately circular and have a diameter $d_p$ equal to or greater than the diameter $e_b$ of the balls, or less than the diameter $e_b$ of the balls for the reasons mentioned above.

BRIEF DESCRIPTION OF THE DRAWINGS

Other features and advantages of the invention will become apparent on reading the following detailed description, by way of nonlimiting example and with reference to the appended drawings in which.

From one figure to another, the same elements are identified by the same references.

DETAILED DESCRIPTION OF THE DRAWINGS

Figure 1A:
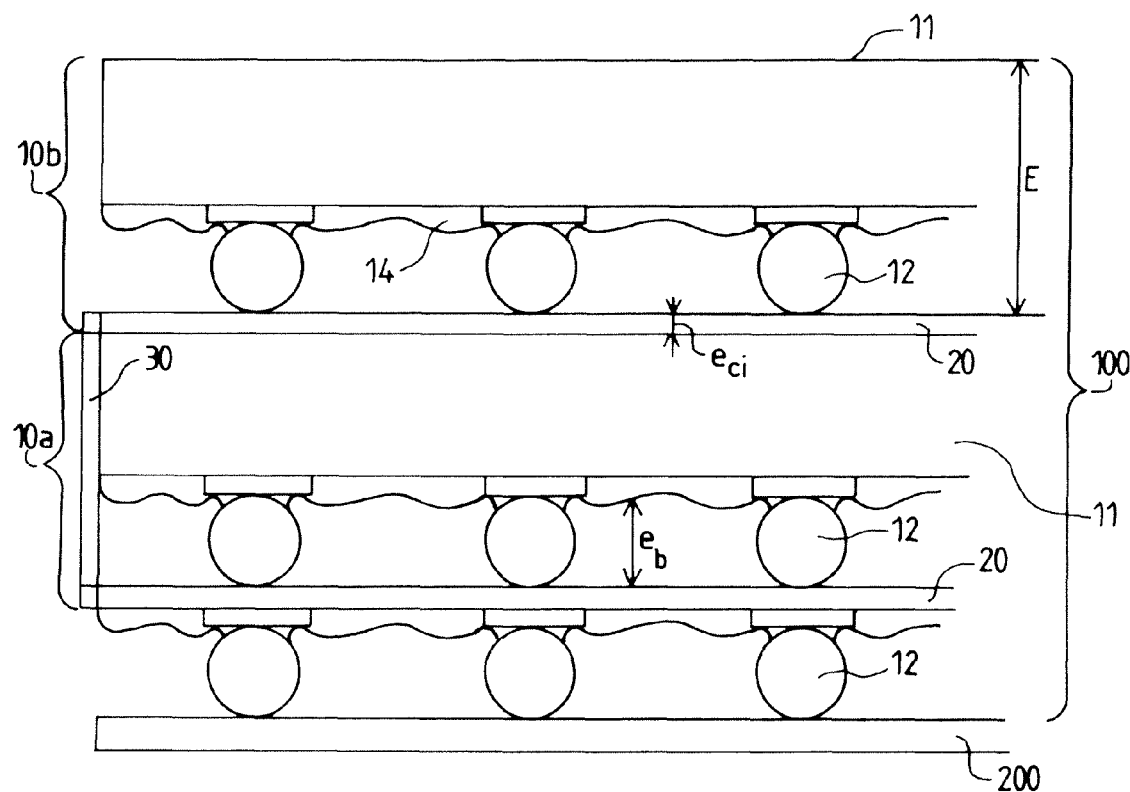
FIGS. 1a and 1b, already described, show schematically a known electronic module comprising two packages, seen in cross section, and a known package interconnection circuit seen from above.
Figure 1B:
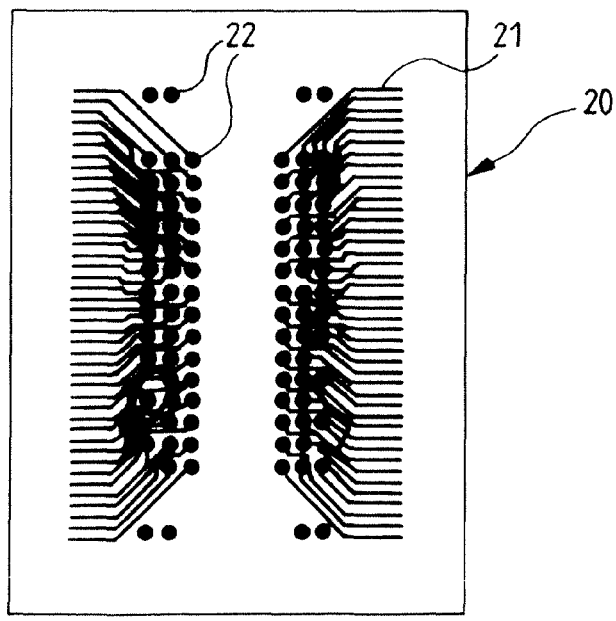
Figure 2A:
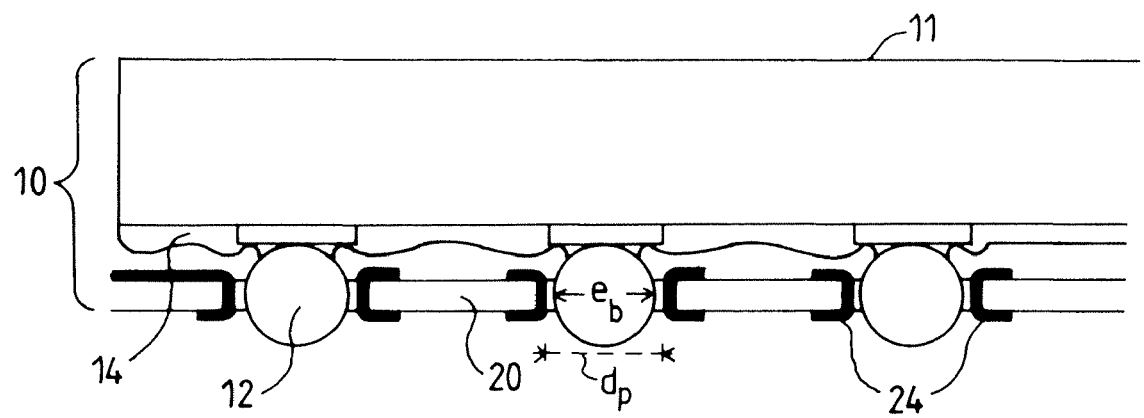
FIGS. 2a and 2b show schematically an electronic package according to the invention before connection, seen in cross section, and a package interconnection circuit according to the invention seen from above.
Figure 2B:
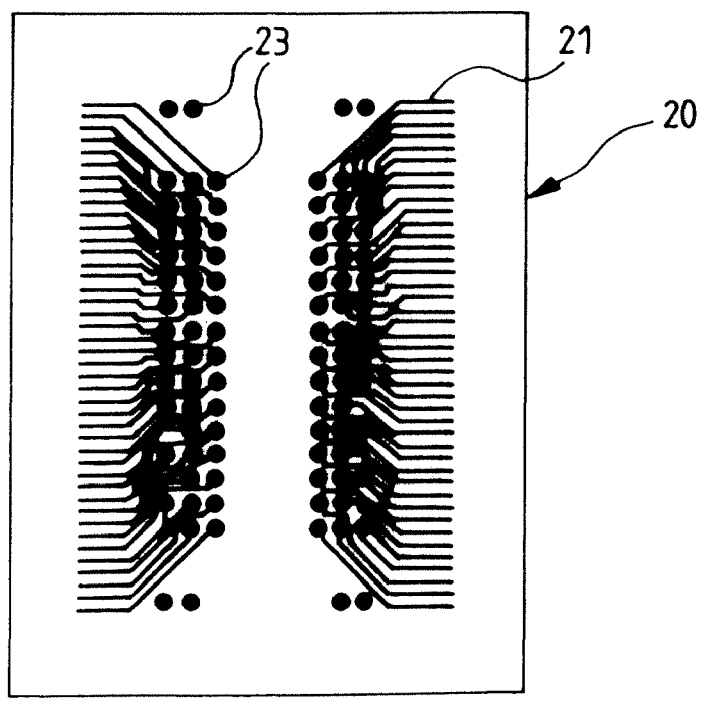

The example of a package 10 represented in cross section in FIG. 2a includes the same elements as that described in relation to FIG. 1a, namely connection balls 12 and a printed circuit 20 for interconnecting the package, adhesively bonded to the lower surface of the package body 11, in this case to the lacquer 14, by means of a resin (not shown in the figure). According to the invention, this circuit 20 is drilled with holes 23 shown in FIG. 2b and placed opposite the balls 12. The pads 22 of the interconnection circuit of the prior art, described in relation to FIG. 1b, have been replaced by metallized holes 23.

These holes are metallized and have a conducting collar 24, the balls being connected to the holes by soldering.

According to a first embodiment of a package illustrated in FIG. 2a, these holes are approximately circular of diameter $d_p$ and are preferably slightly larger than the balls so that the latter pass easily through the circuit before the balls are connected to the circuit. Thus, $d_p \geq e_b$.

Initially, the balls have a thickness $e_b$ of about 0.4 mm for example. Upon connecting them to the metallized holes, the thickness of the balls, which maintain a constant volume, decreases: it may then possibly be compensated for by supplying, during soldering, additional material so as to maintain the initial thickness of the balls. The balls thus have a constant thickness. The material added is that used for the balls, such as for example a lead-free alloy, such as a tin/copper/silver alloy.

The larger the holes, the smaller the routable area of the circuit, which is a drawback. The term "routable area" is understood to mean the area that includes the connection tracks denoted by 21 in FIGS. 1b and 2b.

Figures 3A, 3B:
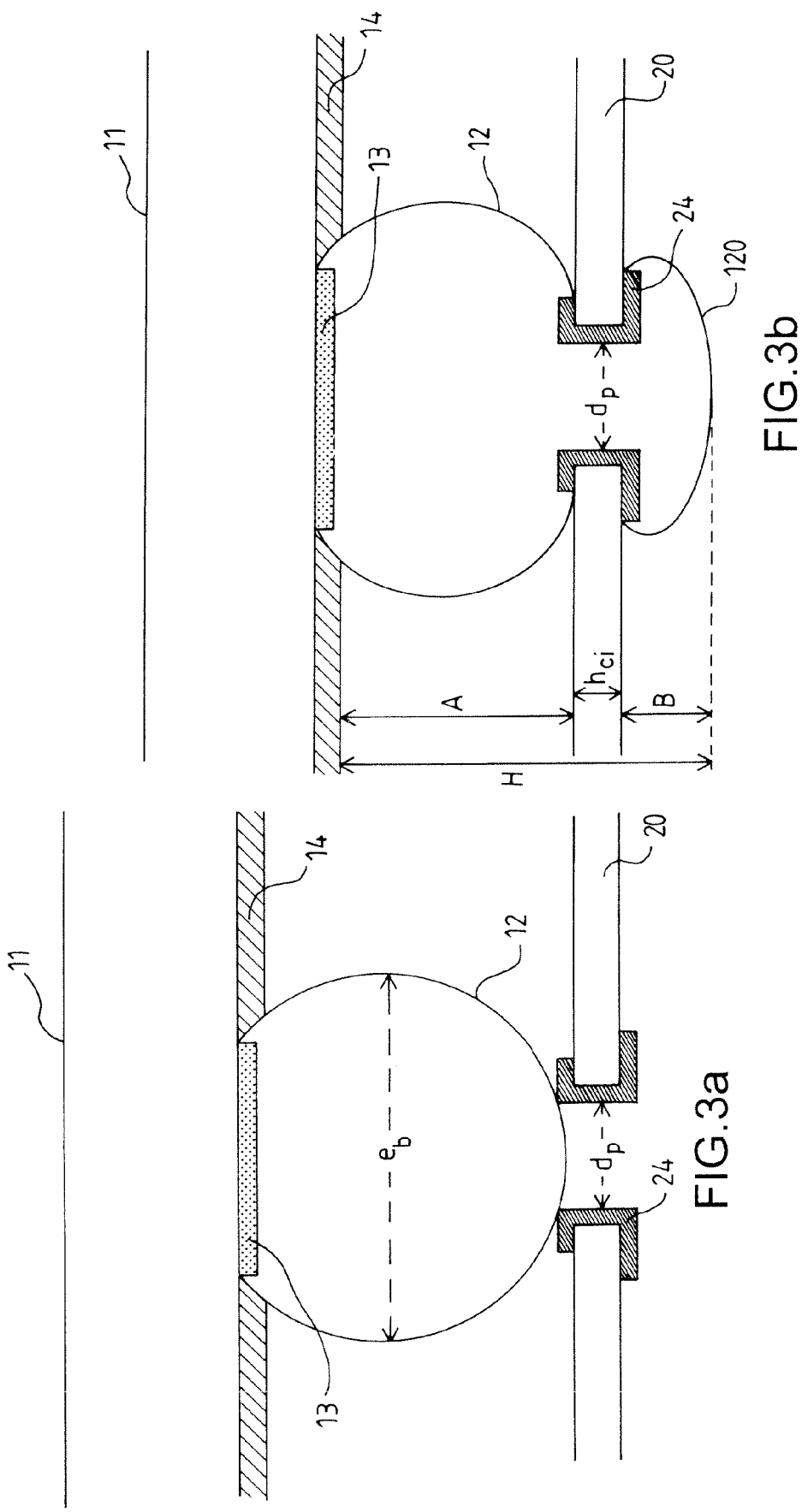
FIGS. 3a and 3b show schematically two steps of an example of one way of producing an electronic package according to the invention, when the holes in the interconnection circuit of the package are smaller than the balls, before the balls have been connected (FIG. 3a) and after they have been connected (FIG. 3b)

According to another embodiment of a package, which may remedy this problem of a reduced routable area and is illustrated in FIGS. 3a and 3b for one ball, the circular holes are smaller than the balls. Therefore $d_p < e_b$. Before the balls are connected to the metallized holes, the drilled circuit 20 is placed beneath the balls 12, as shown in FIG. 3a. During connection of the balls to the circuit, for example by soldering, the balls 12, which deform by capillary effect, also pass through the circuit 20 and create a hemispherical region 120 beneath the circuit 20, as shown in FIG. 3b. By deforming, they attract with them the body 11 of the package, which "descends"—the final height H, equal to that of the connected ball (=A+B) added to that of the drilled circuit (=$h_{ci}$), is equal to or less than the initial thickness of the ball $e_b$ within a margin of tolerance of about 10%. Overall, the height H is less than $e_b(1+10\%)$.

The following results are obtained for an initial ball thickness $e_b$ of 420 µm and $h_{ci}$=100 µm: H=439 µm, A=244 µm and B=95 µm.

Therefore H<$e_b$(1+10%). The total thickness E of the package is consequently less than E+10% $e_b$.

Figure 4A:
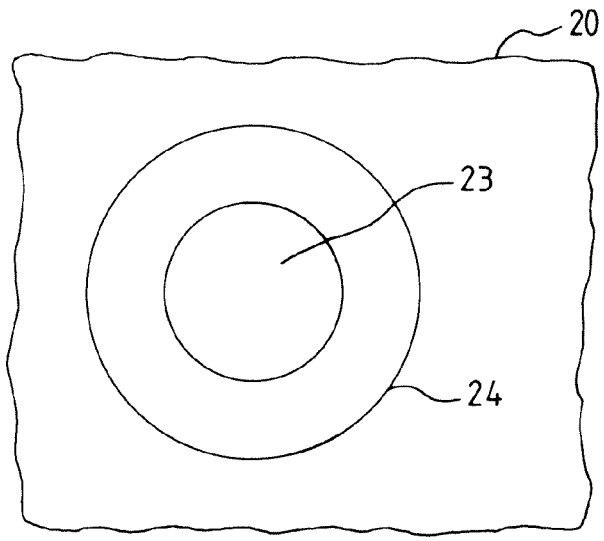
FIGS. 4a, 4b and 4c show schematically examples of the shape of metallization collars of the holes.
Figure 4B:
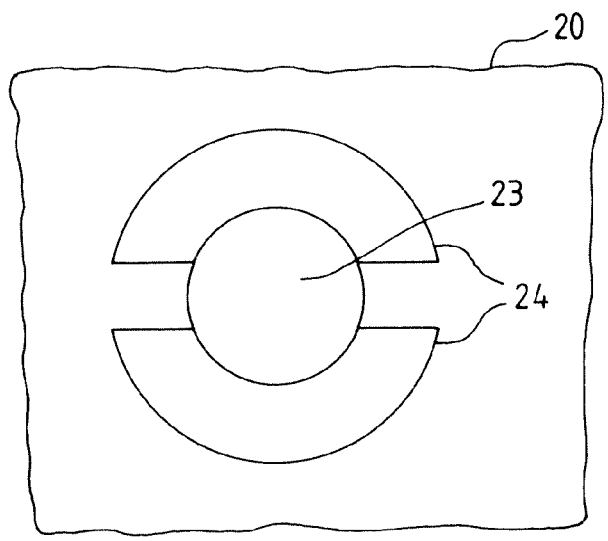
Figure 4C:
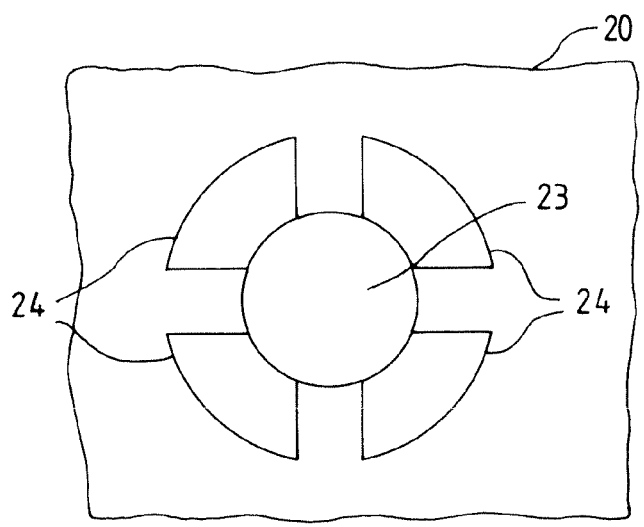

The collar is for example circular, as shown in FIG. 4a, but it may have another shape. Since the second embodiment of the package is based on the capillary effect, this effect can be accentuated by choosing a collar in the form of two parts on either side of the hole, or in the form of quarters, shown in FIGS. 4b and 4c respectively, or more generally in a form having one part of the circular collar.

Figure 5:
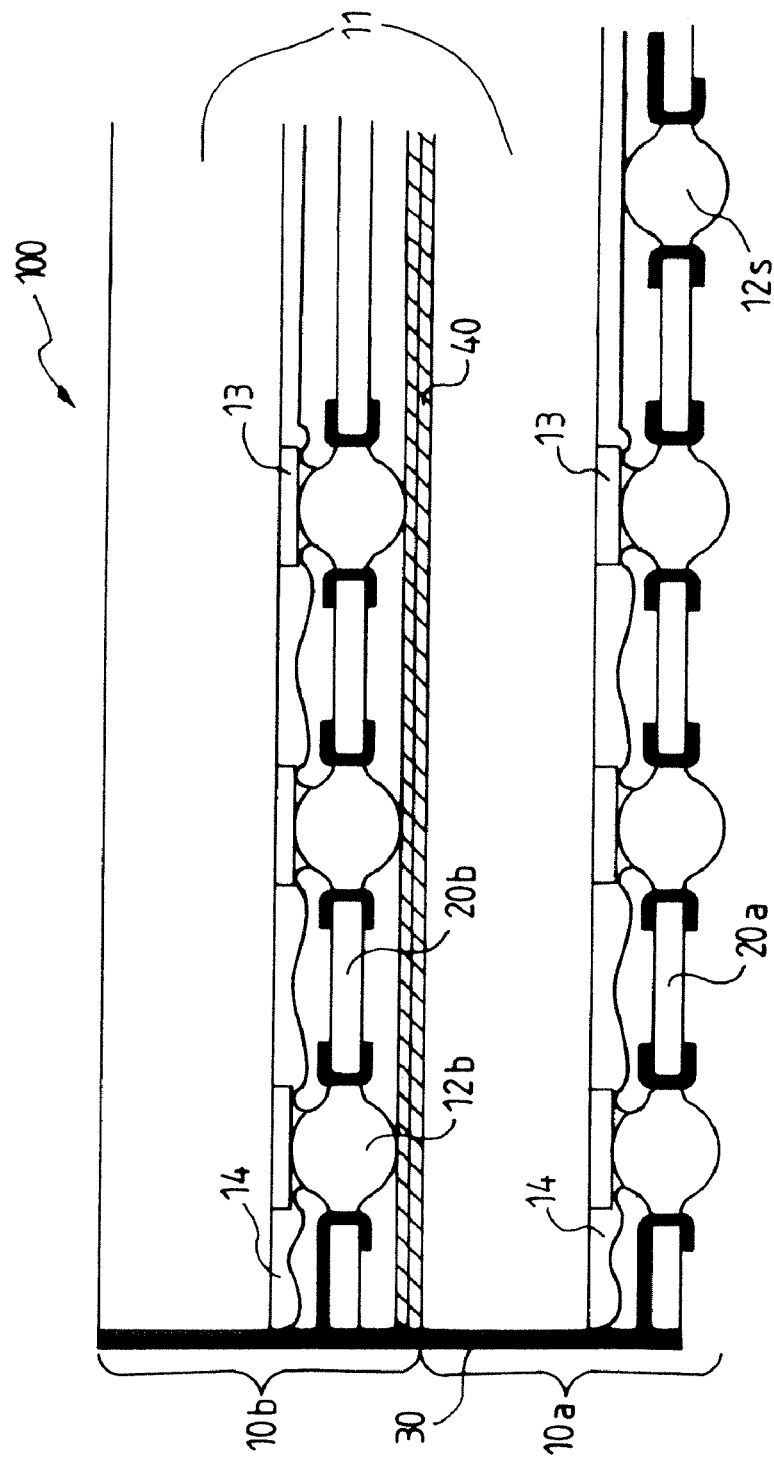
FIG. 5 shows schematically an example of a first embodiment of an electronic module according to the invention comprising two packages, after connection, seen in cross section.

According to a first embodiment of a module, one example of which with two packages is shown in FIG. 5, the module 100 according to the invention includes a lateral element 30 for connecting the drilled circuits together, in this case a metal bus.

Figure 6A:
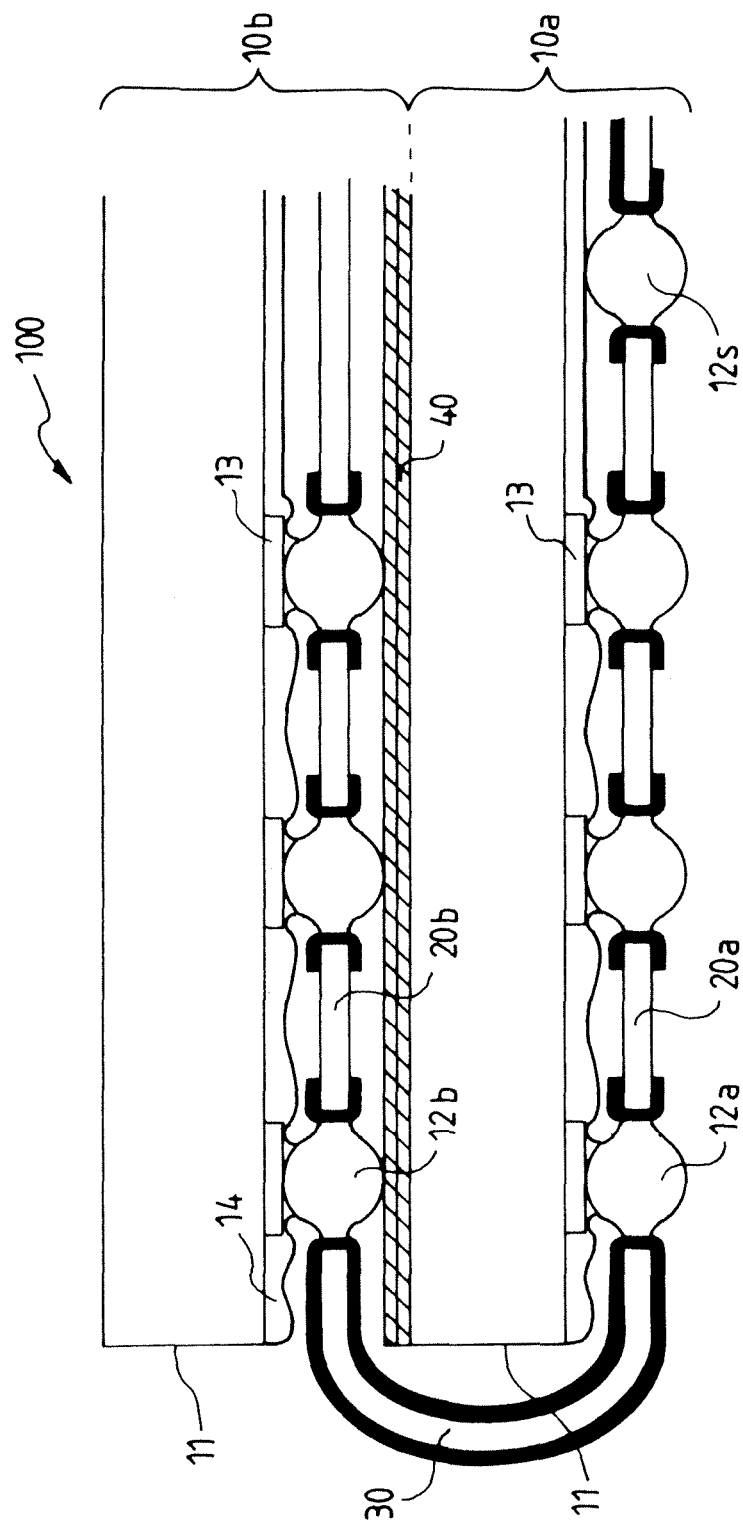
FIGS. 6a and 6b show schematically two examples of a second embodiment of an electronic module according to the invention after connection, seen in cross section, comprising two and three packages respectively.

According to another embodiment of a module, one example of which, again with two packages, is shown in FIG. 6a, the module 100 according to the invention includes a lateral element 30 for connecting the drilled circuits together, which forms with these drilled circuits a single flexible circuit called a flex circuit.

Figure 6B:
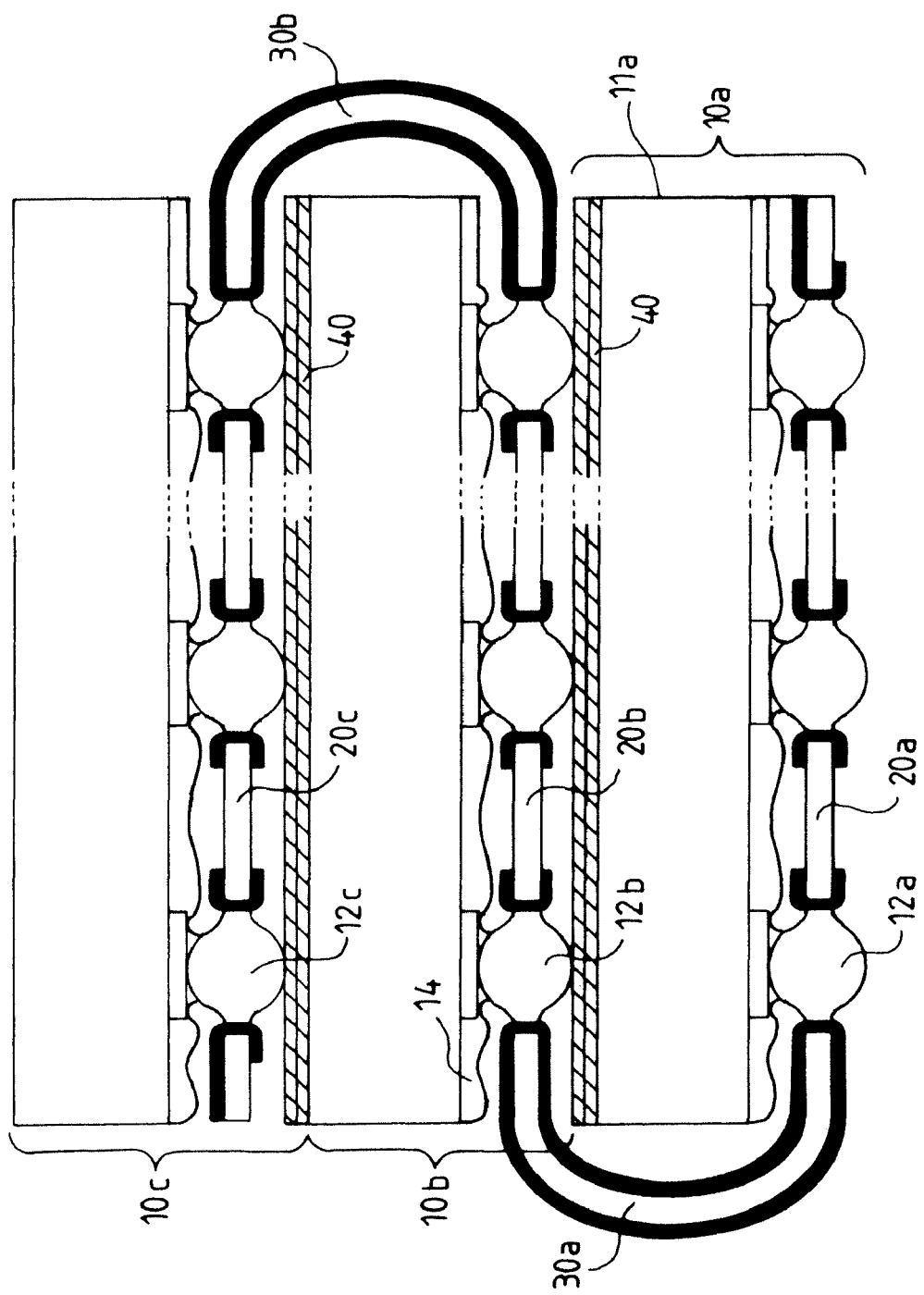

The printed circuit 20 may be made from a single part or from two parts. When it is made from two parts, there are then two flex circuits located on either side of the module. When the module comprises n packages, where n>2, a flex circuit in the form of a concertina can then be used to connect in succession the n packages, as illustrated in FIG. 6b for three packages 10a, 10b and 10c. The flex circuit is then formed from printed circuits 20a, 20b and 20c and lateral connection elements 30a and 30b.

Preferably, a capacitor film 40 of small thickness (between 2 and 80 µm), in order to preserve the integrity of the signals transmitted by the connection elements, is placed beneath the balls and the package lying beneath these balls. This film may also be located on the package so as to have one capacitor film per package. This film may also be located between the balls 12a of the lower package and an interconnection substrate of the module. Finally, this film 40 may be located on and/or beneath each package 10. FIG. 6b shows a package 10c with a film 40 located beneath the balls 12c, and a package 10a with a film 40 located on the body 11a of the package.

The module according to the invention is intended to be placed on a substrate for interconnecting the module. The balls of the lower package allow the lower package to be connected to this substrate.

Figure 7:
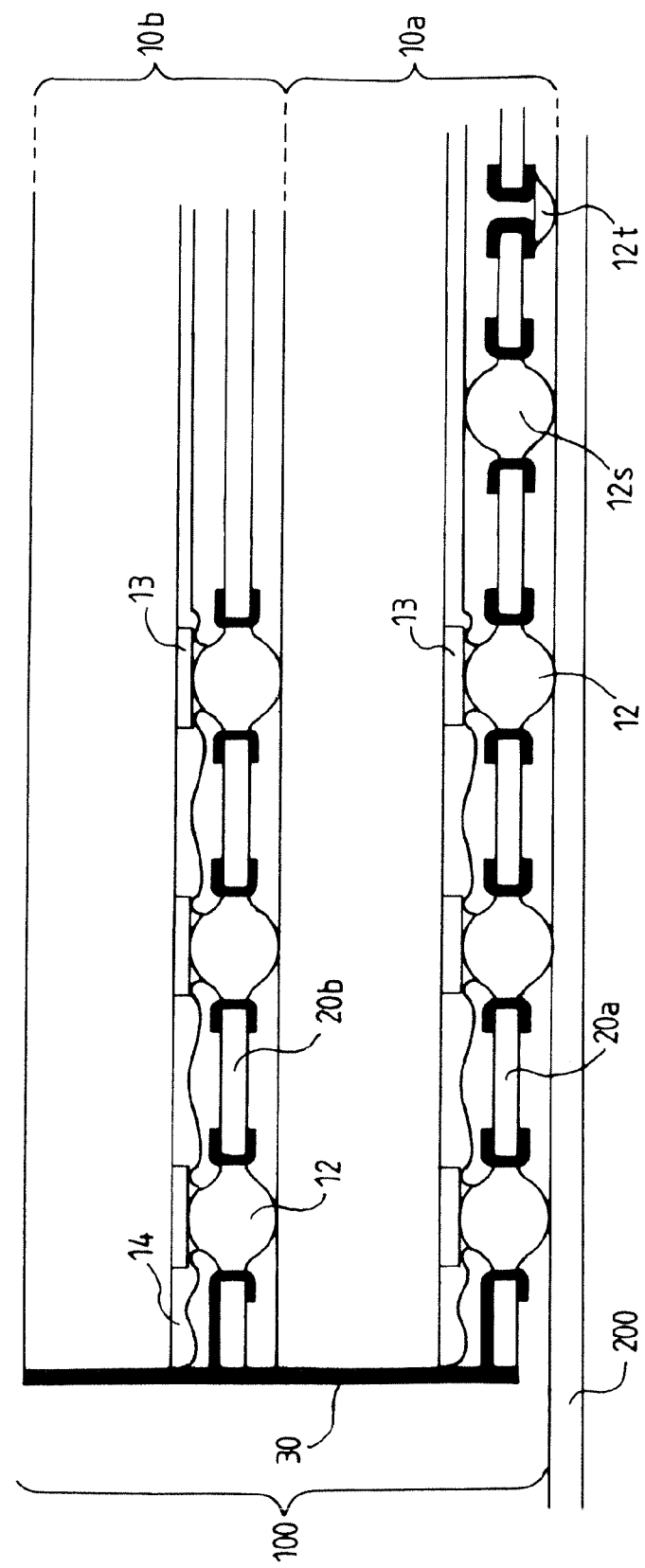
FIG. 7 shows schematically an electronic module according to the invention comprising two packages, which is placed on a module interconnection substrate, after connection.

According to the invention, the drilled circuit 20a of the lower package 10a furthermore includes at least one ball 12s not connected to the lower package by a pad 13, as indicated in FIGS. 5, 6a and 7. This additional ball 12s allows the substrate 200 (FIG. 7) to be connected to an upper package 10b via the lower drilled circuit 20a and the lateral connection element 30 whether this be a metal bus or part of a flex circuit, or some other element. This ball 12s is used to convey a select signal, such as a CS (Chip Select), CKE (Clock Enable) or ODT (On Die Termination) signal, or any other signal. When several signals have to be sent to the same package, the lower drilled circuit has as many additional balls as there are signals. This number of balls is of course increased by the number of packages to be addressed. The lower drilled circuit finally has (n−1)m balls 12s in addition, n being the number of packages and m the number of signals. These balls 12s may be replaced with holes not connected to the lower package, without balls but soldered with solder identical to that of the balls. These soldered holes 12t, one example of which is shown in FIG. 7, are preferably smaller than the other holes—for example, they have a diameter of about 0.1 mm.

The following results were obtained for a module according to the first embodiment: its thickness does not exceed 2.4 mm (n×1.2 mm, here with n=2, the balls for connecting to the substrate 200 becoming unnecessary) instead of 3.1 mm in the case of the module of the prior art; nor does its area exceed that of a package.

Examples have been presented with two packages, but the module according to the invention may have three, four or more packages.

The invention claimed is

1. An electronic module comprising:
    a stack of n packages of predetermined thickness E, where n>1, each package being provided on a lower surface of a body of the package with connection balls of predetermined thickness $e_b$ and said connection balls being connected to a printed circuit for interconnecting the packages,
    at least one capacitor film placed on and/or beneath each of the packages,
    wherein
    said printed circuit is placed on the lower surface of the body of the package level with the balls, and includes metallized holes drilled in the printed circuit,
    the balls are connected with each other,
    each of the balls has a thickness $e_{ci}$ less than $e_b$ so as to obtain a module with a total thickness not exceeding n (E+10% $e_b$), including a lateral element for connecting the drilled printed circuits together,
    the stack has a lower package and a upper package, and
    the drilled printed circuit of the lower package includes at least one ball or a soldered hole not connected to the lower package to connect the upper package to an interconnection substrate of the module, via the drilled printed circuit and the lateral connection element.

2. The electronic module as claimed in claim 1, wherein the printed interconnection circuit of the package has an area substantially of the same size as that of the package.

3. The electronic module as claimed in claim 1, wherein the lateral element is a metal bus.

4. The electronic module as claimed in claim 1, wherein the lateral connection element forms, with these drilled printed circuits, a flexible circuit.

5. The electronic module as claimed in claim 1, wherein the balls connected to the holes have a constant thickness $e_b$.

6. The electronic module as claimed in claim 1, wherein the holes are approximately circular and have a diameter $d_p$ equal to or greater than the diameter $e_b$ of the balls.

7. The electronic module as claimed in claim 1, wherein the holes are approximately circular and have a diameter $d_p$ less than the diameter $e_b$ of the balls.

8. The electronic module as claimed in claim 1, wherein the holes are metallized as a circular collar or in two parts or in quarters.

9. The electronic module as claimed in claim 1, wherein the packages are packages of the BGA or FBGA type.

10. An electronic module comprising:
    a stack of n packages of predetermined thickness E, where n>1, each package being provided on a lower surface of a body of the package with connection balls of predetermined thickness $e_b$ and said connection balls being connected to a printed circuit for interconnecting the packages,
    wherein
    said printed circuit is placed on the lower surface of the body of the package level with the balls, and includes metallized holes drilled in the printed circuit,
    the balls are connected with each other,
    each of the balls has a thickness $e_{ci}$ less than $e_b$ so as to obtain a module with a total thickness not exceeding n (E+10% $e_b$), including a lateral element for connecting the drilled printed circuits together,
    the stack has a lower package and a upper package,
    the drilled printed circuit of the lower package includes at least one ball or a soldered hole not connected to the lower package to connect the upper package to an interconnection substrate of the module, via the drilled printed circuit and the lateral connection element,
    the lateral connection element forms, with these drilled printed circuits, a flexible circuit, and
    at least three drilled printed circuits are connected together by a flex circuit in the form of a concertina.

* * * * *